United States Patent
Gupta et al.

(10) Patent No.: US 12,174,064 B2
(45) Date of Patent: Dec. 24, 2024

(54) CIRCUIT FOR HIGH-SENSITIVITY RADIATION SENSING

(71) Applicant: ams-OSRAM AG, Premstaetten (AT)

(72) Inventors: Rajesh Gupta, Eindhoven (NL); Ravi Kumar Adusumalli, Eindhoven (NL); Robert Van Zeeland, Eindhoven (NL); Rahul Thottathil, Eindhoven (NL)

(73) Assignee: AMS-OSRAM AG, Premstaetten (AT)

( * ) Notice: Subject to any disclaimer, the term of this patent is extended or adjusted under 35 U.S.C. 154(b) by 0 days.

(21) Appl. No.: 18/267,725

(22) PCT Filed: Dec. 8, 2021

(86) PCT No.: PCT/EP2021/084872
§ 371 (c)(1),
(2) Date: Jun. 15, 2023

(87) PCT Pub. No.: WO2022/128700
PCT Pub. Date: Jun. 23, 2022

(65) Prior Publication Data
US 2024/0102857 A1    Mar. 28, 2024

(30) Foreign Application Priority Data
Dec. 15, 2020 (GB) ..................... 2019768

(51) Int. Cl.
*G01J 1/44* (2006.01)
*G01R 19/00* (2006.01)

(52) U.S. Cl.
CPC ............ *G01J 1/44* (2013.01); *G01R 19/0084* (2013.01); *G01J 2001/446* (2013.01)

(58) Field of Classification Search
CPC .. G01J 1/44; G01J 2001/446; G01J 2001/444; G01R 19/0084; H04N 25/77
See application file for complete search history.

(56) References Cited

U.S. PATENT DOCUMENTS 6,054,704 A     4/2000  Pritchard et al.
6,720,595 B2 *  4/2004  Clevenger ......... H01L 27/14634
                                                  257/292

(Continued)

FOREIGN PATENT DOCUMENTS

EP       3425353 A1    1/2019
JP     H01305328 A   12/1989

(Continued)

OTHER PUBLICATIONS

International Search Report and Written Opinion issued in International Patent Application No. PCT/EP2021/084872 on Apr. 21, 2022.

(Continued)

*Primary Examiner* — Seung C Sohn
(74) *Attorney, Agent, or Firm* — VIERING, JENTSCHURA & PARTNER mbB

(57) ABSTRACT

A circuit for sensing radiation with high sensitivity is disclosed. The circuit comprises a first transistor configurable to reset a voltage-level at a circuit node to a voltage reference. The circuit also comprises measurement circuitry configured to measure the voltage-level at the circuit node, and at least one photodiode configured to vary the voltage-level at the circuit node in response to radiation incident upon the photodiode during an integration period. The circuit also comprises processing circuitry configured to control the first transistor to reset the voltage-level at the circuit node and to subsequently configure the measurement circuitry to measure the voltage-level at a start and at an end of the integration period.

10 Claims, 5 Drawing Sheets

(56) References Cited

U.S. PATENT DOCUMENTS

| | | | |
|---|---|---|---|
| 7,859,486 B2 * | 12/2010 | Kwon | H04N 5/58 |
| | | | 345/212 |
| 2002/0185589 A1 | 12/2002 | Cazaux | |
| 2005/0167602 A1 | 8/2005 | Dierickx | |
| 2006/0108511 A1 * | 5/2006 | Cok | G01J 1/46 |
| | | | 250/214 R |
| 2009/0206378 A1 * | 8/2009 | Kim | G09G 3/3233 |
| | | | 257/292 |
| 2019/0379846 A1 | 12/2019 | Chen et al. | |
| 2020/0103275 A1 | 4/2020 | Fujimoto | |

FOREIGN PATENT DOCUMENTS

| | | | |
|---|---|---|---|
| WO | 2011156507 A1 | 12/2011 | |
| WO | 2013030561 A1 | 3/2013 | |

OTHER PUBLICATIONS

Great Britain Search Report issued in GB Patent Application No. GB2019768.7 on Jun. 7, 2021.

* cited by examiner

CIRCUIT FOR HIGH-SENSITIVITY RADIATION SENSING

CROSS REFERENCE TO RELATED APPLICATIONS

The present application is a U.S. national stage of PCT International Patent Application No. PCT/EP2021/084872, filed on Dec. 8, 2021, which claims priority to GB2019768.7, filed on Dec. 15, 2020. The contents of the above applications are incorporated herein by reference in their entirety.

FIELD OF INVENTION

The present disclosure relates to a circuit for high-sensitivity radiation sensing. The circuit may be for radiation-sensors used in applications such as ambient light sensing, proximity sensing and flicker detection.

BACKGROUND TO INVENTION

Modern consumer electronics, such as smartphones, increasingly implement a variety of sensors. For example, such sensors may include ambient light sensors, proximity sensors, sensors configured to detect flicker in ambient light, and the like.

Such sensors may be required to meet stringent requirements relating to accuracy, sensitivity and, in particular, signal-to-noise ratio.

For example, in some applications such as Behind-OLED applications, sensors may be subject to very low levels of incident radiation, making accurate detection of incident radiation levels difficult to achieve.

Furthermore, implementing sensors that are capable of meeting stringent accuracy and sensitivity requirements, while also taking into account further requirements relating to cost, miniaturization, power limitations, and fundamental limitations of underlying device fabrication technologies, is becoming increasingly difficult.

Some sensors may be implemented with photodiodes for detection of incident radiation. However, photodiodes and the circuits in which photodiodes are implemented, also known to exhibit limitations in their sensing capabilities. For example, it is known that photodiodes are subject to leakage, which may be manifested as a measureable 'dark current' that can affect an absolute measurement of a radiation-level.

Furthermore, while highly accurate measurement circuitry may be implemented to measure a photocurrent induced by radiation incident upon a photodiode, such circuitry may also introduce errors. For example, crosstalk from neighboring circuitry, and any stray capacitance, such as parasitic capacitance in components of the circuitry or any interconnects, may affect an overall performance of the circuit.

Thus, it is desirable to implement a circuit suitable for accurate radiation sensing in applications such as ambient light sensing and proximity sensing, and capable of meeting stringent requirements relating to, among other things, sensitivity and signal-to-noise ratio.

It is therefore an object of at least one embodiment of at least one aspect of the present disclosure to obviate or at least mitigate at least one of the above identified shortcomings of the prior art.

SUMMARY OF INVENTION

The present disclosure relates to a circuit for high-sensitivity radiation sensing, and suitable for use in applications such as ambient light sensing, proximity sensing and flicker detection. According to a first aspect of the disclosure, there is provided a circuit for sensing radiation, the circuit comprising: a first transistor configurable to reset a voltage-level at a circuit node to a voltage reference; measurement circuitry configured to measure the voltage-level at the circuit node; at least one photodiode configured to vary the voltage-level at the circuit node in response to radiation incident upon the photodiode during an integration period; and processing circuitry configured to control the first transistor to reset the voltage-level at the circuit node and to subsequently configure the measurement circuitry to measure the voltage-level at a start and at an end of the integration period.

Advantageously, by measuring the voltage-level at a start and end of the integration period, errors such as systematic errors that may be introduced due to dark current, can be accounted for. As such, extremely high-sensitivity measurements of an intensity of incident radiation may be made.

The processing circuitry may be configured to determine an intensity of the incident radiation based upon a difference between the voltage-level at the start and at the end of the integration period.

Advantageously, by determining the intensity of the incident radiation based upon the difference, errors such as errors due to leakage for the photodiode or other factors that may contribute to a 'dark current' may be accounted for, e.g. subtracted from the measured voltage-level at the end of the integration period.

The at least one photodiode may comprise an island photodiode.

Advantageously, an island photodiode may exhibit an extremely low capacitance. As such, a sensitivity of the circuit may be maximized. Furthermore, a leakage from the photodiode may be minimized, thus resulting in reduced errors in measurements of the intensity of incident radiation.

The circuit may comprise a capacitor having a first terminal coupled to the circuit node and a second terminal coupled to the voltage reference.

Advantageously, inclusion of a capacitor in the circuit may provide a means to more accurately provide a measurable voltage-level corresponding to an amount of charge generated by photoelectric effect in the photodiode. Furthermore, such a capacitor can help ensure adequate sensitivity is achieved while meeting signal-to-noise requirements.

The circuit may comprise a second transistor controlled by the processing circuitry and configurable to isolate the at least one photodiode from the measurement circuitry.

The processing circuitry may be configured to determine a difference between measurements of the voltage-level made by the measurement circuitry with and without the at least one photodiode isolated from the measurement circuitry.

Advantageously, by isolating the at least one photodiode from the measurement circuitry, the measurement circuitry can be configured to perform a measurement that accounts for errors, such as systematic errors, in the circuit. Such measured errors may subsequently be subtracted from a measurement of radiation intensity made using the photodiode.

The circuit may comprising an error amplifier circuit configured to minimise a bias across the at least one photodiode.

Advantageously, by minimizing a bias across the at least one photodiode, a leakage current from the photodiode can be minimized, thus reducing errors in the circuit and increasing a sensitivity and accuracy of measurements of incident radiation.

The circuit may comprise a third transistor. An output of the error amplifier circuit may be coupled to a gate of the third transistor. A source of the third transistor may be coupled to a cathode of the at least one photodiode. A drain of the third transistor may be coupled to the circuit node. In some embodiments, the source of the third transistor may be coupled to a cathode of the at least one photodiode via at least one other transistor, e.g. another transistor may reside in a path between the source of the third transistor and the cathode of the at least one photodiode, as described below in more detail.

A voltage-level at a source of the third transistor may corresponds to a voltage-level at a cathode of the at least one photodiode, e.g. taking into account any voltage drop across any transistors that may be in a path between the source of the third transistor and the cathode of the at least one photodiode.

Advantageously, such an arrangement enables the error amplifier to correct a bias that may exist across the photodiode. Furthermore, by having the error amplifier coupled to the gate of the third transistor, the error amplifier is prevented from driving current towards the circuit node. That is, the error amplifier may be configured to maintain the bias across the at least one photodiode at, or close to, zero volts without drawing any current from it.

The error amplifier circuit may be configurable to provide a negative voltage at the gate of the third transistor.

In some embodiments it may be necessary to drive a slightly negative voltage to fully remove a bias from across the at least one photodiode, when taking into account any voltage drop that may exist within the circuit between an output of the error amplifier and the cathode of the at least one photodiode.

A first input to the error amplifier circuit may be coupled to an anode of the at least one photodiode. A second input to the error amplifier circuit may be coupled to the cathode. In some embodiments, the second input to the error amplifier circuit may be coupled to the cathode via one or more transistors in a path between the second input to the error amplifier circuit and the cathode. That is, a voltage-level at the second input to the error amplifier circuit may correspond to a voltage level at the cathode, taking into account any voltage drop across any transistor that may reside in a path between the second input to the error amplifier and the cathode.

The circuit may comprise a fourth transistor configured as a source-follower. A gate of the fourth transistor may be coupled to the circuit node. A source of the fourth transistor may be coupled to the measurement circuitry.

The processing circuitry may comprise a timer configured to define the integration period.

According to a second aspect of the disclosure, there is provided a circuit for sensing radiation, the circuit comprising: at least one photodiode configured to vary a voltage-level at a circuit node in response to radiation incident upon the photodiode during an integration period; measurement circuitry configured to measure the voltage-level at the circuit node; a first transistor configurable to isolate the at least one photodiode from the measurement circuitry; and processing circuitry configured to: determine a difference between measurements of the voltage-level made by the measurement circuitry with and without the at least one photodiode isolated from the measurement circuitry; and to determine an intensity of the incident radiation based upon subtraction of the difference from a voltage-level measured at the end of the integration period.

The circuit may comprise a second transistor configurable to reset a voltage-level at the circuit node to a voltage reference.

The processing circuitry may be configured to control the second transistor to reset the voltage-level at the circuit node and to subsequently configure the measurement circuitry to measure the voltage-level at a start and at an end of the integration period.

The processing circuitry may be configured to determine an intensity of the incident radiation based upon a difference between the voltage-level at the start and at the end of the integration period.

The at least one photodiode may comprise an island photodiode.

The circuit may comprise a capacitor having a first terminal coupled to the circuit node and a second terminal coupled to the voltage reference.

The circuit may comprising an error amplifier circuit configured to minimize a bias across the at least one photodiode.

The circuit may comprising a third transistor. An output of the error amplifier circuit may be coupled to a gate of the third transistor. A source of the third transistor may be coupled to a cathode of the at least one photodiode. A drain of the third transistor may be coupled to the circuit node.

The error amplifier circuit may be configurable to provide a negative voltage at the gate of the third transistor.

A first input to the error amplifier circuit may be coupled to an anode of the at least one photodiode. A second input to the error amplifier circuit may be coupled to the cathode.

The circuit may comprise a fourth transistor configured as a source-follower. A gate of the fourth transistor may be coupled to the circuit node. A source of the fourth transistor may be coupled to the measurement circuitry.

The processing circuitry may comprise a timer configured to define the integration period.

According to a third aspect of the disclosure, there is provided a circuit for sensing radiation, the circuit comprising: at least one photodiode configured to vary the voltage-level at a circuit node in response to radiation incident upon the photodiode during an integration period; measurement circuitry configured to measure the voltage-level at the circuit node; an error amplifier circuit configured to minimise a bias across the at least one photodiode during the integration period; and processing circuitry configured to control the measurement circuitry to measure the voltage-level at an end of the integration period.

The circuit may comprise a first transistor configurable to reset a voltage-level at the circuit node to a voltage reference.

The processing circuitry may be configured to control the first transistor to reset the voltage-level at the circuit node and to subsequently configure the measurement circuitry to measure the voltage-level at a start and at an end of the integration period.

The processing circuitry may be configured to determine an intensity of the incident radiation based upon a difference between the voltage-level at the start and at the end of the integration period.

The at least one photodiode may comprise an island photodiode.

The circuit may comprise a capacitor having a first terminal coupled to the circuit node and a second terminal coupled to the voltage reference.

The circuit may comprise a second transistor controlled by the processing circuitry and configurable to isolate the at least one photodiode from the measurement circuitry.

The processing circuitry may be configured to determine a difference between measurements of the voltage-level made by the measurement circuitry with and without the at least one photodiode isolated from the measurement circuitry.

The circuit may comprise a third transistor. An output of the error amplifier circuit may be coupled to a gate of the third transistor. A source of the third transistor may be coupled to a cathode of the at least one photodiode. A drain of the third transistor may be coupled to the circuit node.

The error amplifier circuit may be configurable to provide a negative voltage at the gate of the third transistor.

A first input to the error amplifier circuit may be coupled to an anode of the at least one photodiode. A second input to the error amplifier circuit is coupled to the cathode.

The circuit may comprising a fourth transistor configured as a source-follower. A gate of the fourth transistor may be coupled to the circuit node. A source of the fourth transistor may be coupled to the measurement circuitry.

The processing circuitry may comprise a timer configured to define the integration period.

According to a third aspect of the disclosure, there is provided an apparatus comprising the circuit according to any of the above aspects. The apparatus is configured for at least one of: ambient light sensing; proximity sensing; or flicker detection.

The apparatus may be a communications device. The apparatus of may be one of: a smartphone; a cellular telephone; a tablet; a laptop.

The circuit may be coupled to a processor and/or a storage device.

The apparatus may comprise an LED display.

The at least one photodiode of the circuit may be disposed rearward of a radiation-emitting surface of the LED display and configured to receive radiation propagating through the LED display.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF DRAWINGS

These and other aspects of the present disclosure will now be described, by way of example only, with reference to the accompanying drawings, which are.

DETAILED DESCRIPTION OF THE PREFERRED EMBODIMENTS

Figure 1:
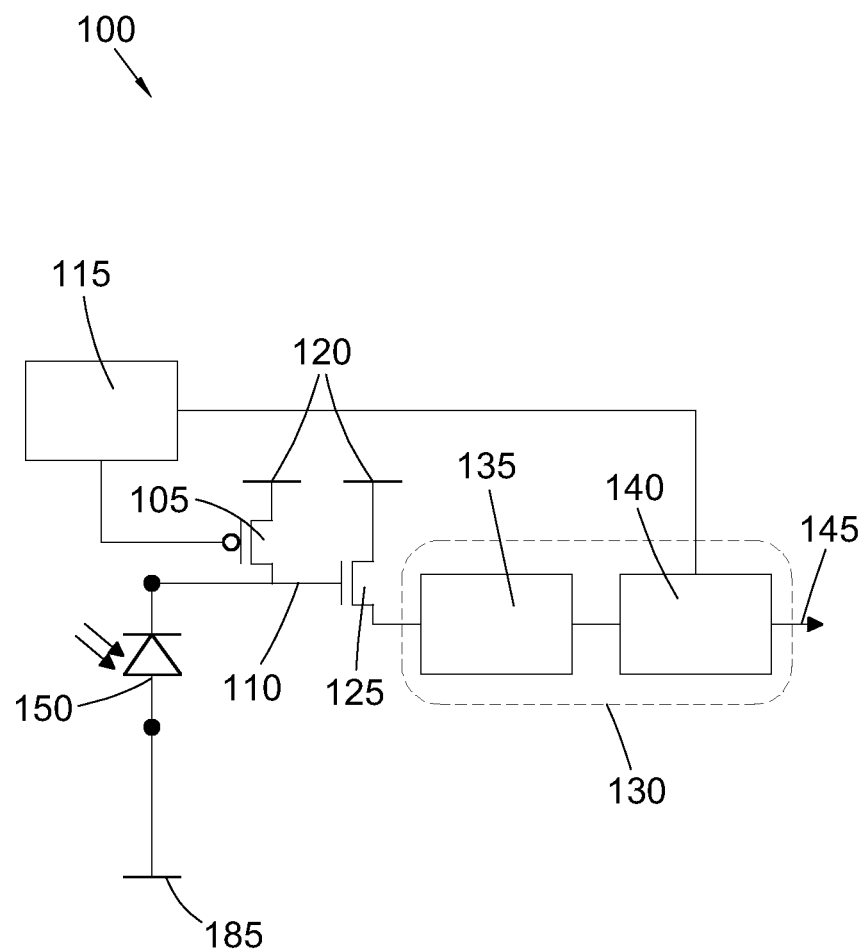
FIG. 1 a representation of a circuit for sensing radiation according to an embodiment of the disclosure.

FIG. 1 depicts a representation of a circuit 100 for sensing radiation according to an embodiment of the disclosure. The circuit 100 is for high-sensitivity radiation sensing, and is particularly suitable for use in applications such as ambient light sensing, proximity sensing and flicker detection, where an intensity of radiation to be sensed may be particularly low.

The circuit 100 comprises a first transistor 105. The first transistor 105 is configurable to reset a voltage-level at a circuit node 110 to a voltage-level defined by a voltage reference 120. In some embodiments, the voltage reference 120 may be a power supply rail, e.g., VDD.

A gate of the first transistor 105 is coupled to processing circuitry 115. The processing circuitry 115 may for example, comprise a processor, digital logic, a state machine, or the like. In some embodiments, the processing circuitry 115 may comprise a programmable processor and a memory.

A source of the first transistor 105 is coupled to the voltage reference 120. A drain of the first transistor 105 is coupled to the circuit node 110. The processing circuitry 115 may be configurable to control a voltage at the gate of the first transistor to enable current flow between the source and drain. As such, the processing circuitry 115 is configurable to reset a voltage-level at a circuit node 110 to a voltage-level of the voltage reference 120, minus any voltage dropped across the source-drain of the first transistor 105.

Also depicted in the example circuit of FIG. 1 is a further transistor 125 configured as a source-follower. A gate of the further transistor 125 is coupled to the circuit node 110. A drain of the further transistor 125 is coupled to the voltage reference 120, and a source of the further transistor 125 is coupled to measurement circuitry 130. As such, the further transistor 125 operates as a buffer, enabling a voltage-level corresponding to a voltage-level at the circuit node 110 to be measured by the measurement circuitry 130, without drawing significant current from the circuit node 110.

In the example embodiment of FIG. 1, the measurement circuitry 130 comprises a voltage amplifier 135 and an analog-to-digital converter 140. In use, the voltage amplifier 135 may be configured to amplifier a voltage at the source of the further transistor 125, such as to use a greater proportion of a dynamic range of the analog-to-digital converter 140.

In some embodiments, the voltage amplifier 135 may comprise an operational amplifier configured as a non-inverting operational amplifier.

The analog-to-digital converter 140 may be of any appropriate type as known in the art, for example a delta-sigma modulator, a successive approximation analog-to-digital converter, or the like.

As such, the measurement circuitry 130 is configured to measure the voltage-level corresponding to the voltage-level at the circuit node 110. That is, the measurement circuitry 130 is configured to measure the voltage-level at the circuit node 110 minus any voltage drop across the further transistor 125.

In some embodiments, the processing circuitry 115 is configured to control the measurement circuitry 130 and/or receive an output from the measurement circuitry 130. That is, in some embodiments, the processing circuitry 115 may configure the measurement circuitry to measure the voltage-level at the circuit node 110.

The example circuit 100 of FIG. 1 comprises a photodiode 150. A cathode of the photodiode 150 is coupled to the circuit node 110, e.g. to drain 110 of the first transistor 105 and the gate of the further transistor 125.

An anode of the photodiode 150 is coupled to a further voltage reference 185 which in the example circuit 100 of FIG. 1, is a ground reference, e.g. 0 volts.

Operation of the circuit 100 is as follows. At an initial time, the first transistor 105 is turned on, e.g. a voltage is applied at the gate of the first transistor to enable current to flow from source to drain, thereby charging the photodiode 150 and setting an initial voltage-level at the cathode, e.g. the circuit node 110, to a voltage-level defined by the voltage reference 120.

Subsequently, the first transistor 105 is turned off, thereby isolating the cathode of the photodiode 150 from the voltage reference 120. In some embodiments, a time when the first transistor 105 is turned off establishes a start of an integration period. In other embodiments, the integration period may commence at a time after the first transistor 105 is turned off.

In some embodiments, the processing circuitry 115 comprises a timer, or is configured to operate as a timer to define the integration period.

As the photodiode 150 is exposed to incident radiation, a generated photocurrent discharges the cathode of the photodiode 150. As such, a voltage-level at the circuit node 110 drops. That is, the photodiode 150 is configured to vary the voltage-level at the circuit node 110 in response to radiation incident upon the photodiode 150 during the integration period.

As described above, the voltage amplifier 135 and analog to digital converter 140 are configured to measure the voltage level at the circuit node 110.

In an embodiment of the invention, the processing circuitry 115 is configured to control the first transistor 105 to reset the voltage-level at the circuit node 110 and to subsequently configure the measurement circuitry 130 to measure the voltage-level at a start and then at an end of the integration period. That is, in order to reduce the effects of noise, the processing circuitry 115 is configured to control the measurement circuitry 130 to perform two measurements. A difference between these measurements may provide a better indication of an intensity of radiation incident upon the photodiode 150 than a single measurement. That is, errors such as systematic errors that may be introduced due to dark current, can be accounted for. As such, extremely high-sensitivity measurements of an intensity of incident radiation may be made.

In some embodiments, the processing circuitry 115 may be configured to determine the difference between the measurements. In such embodiments, an output from the analog-to-digital converter 140 may be provided to the processing circuitry 115. In some embodiments, an output 145 from the analog-to-digital converter 140 is additionally or alternatively provided to further processing circuitry (not shown).

It will be appreciated that although FIG. 1 depicts a single photodiode 150, in some embodiments a plurality of photodiodes may be implemented. In some embodiments, the one or more photodiodes is/are island photodiodes. For example, in some embodiments a plurality of island photodiodes may be arranged in a grid-like or array-like structure, having a common cathode coupled to the circuit node 110.

An island photodiode is described in more detail below with reference to FIG. 4. A salient feature of an island photodiode is an extremely low capacitance, relative to a 'traditional' p-n junction based n-well photodiodes or pinned photodiode. As such, a rate of discharge, and hence rate at which a voltage at a cathode of the island photodiode may drop from the voltage-level defined by the voltage reference 120 to a lower voltage-level, may be high. Thus, use of island photodiodes may lead to an extremely sensitive ambient radiation detection, thus necessitating the above-described measurement of the voltage-level at the circuit node 110 at the start and end of the integration period to minimize errors, e.g., to ensure high sensitivity while maintaining a sufficiently high signal-to-noise ratio.

Figure 2:
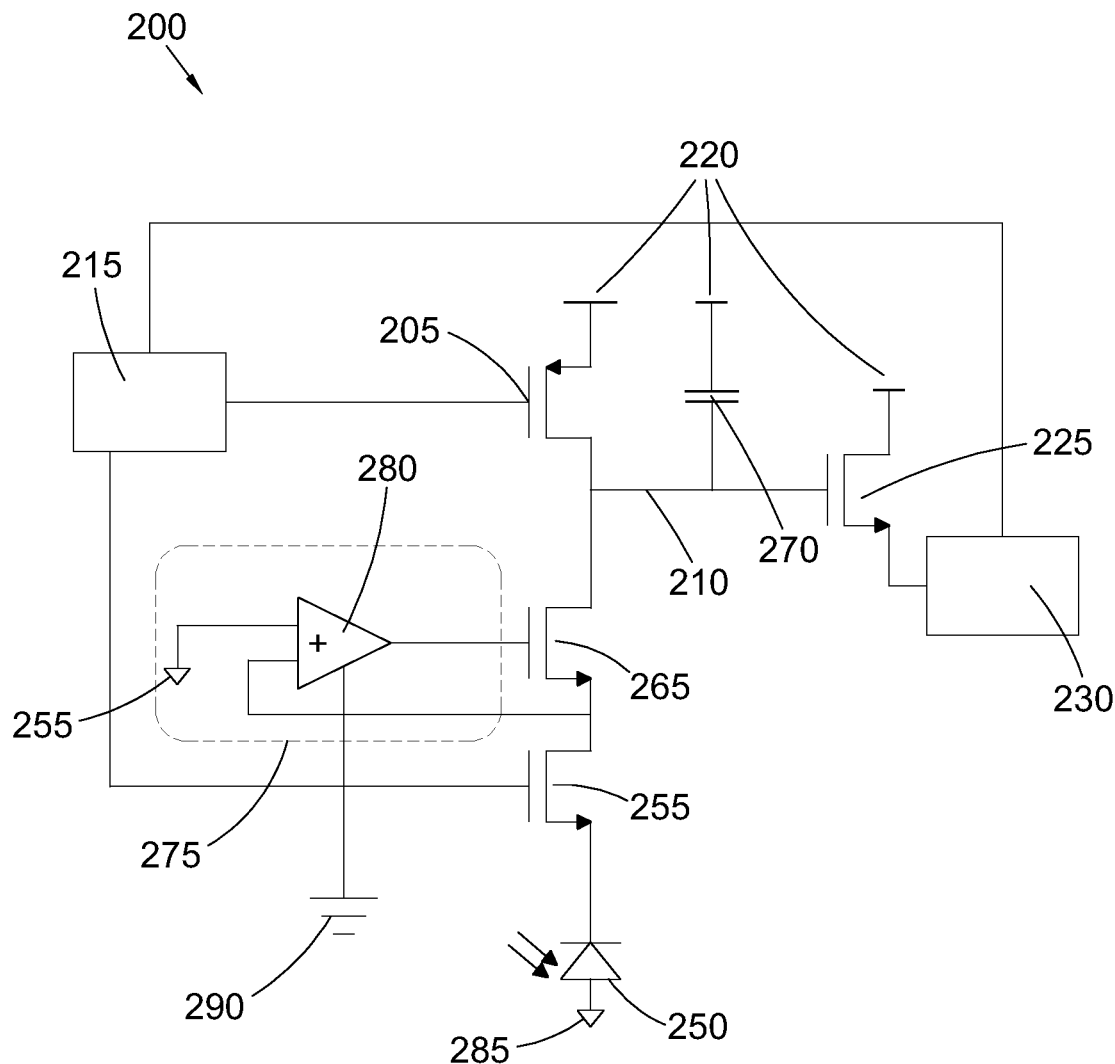
FIG. 2 a representation of a circuit for sensing radiation according to a further embodiment of the disclosure.

FIG. 2 depicts a representation of a circuit 200 for sensing radiation according to a further embodiment of the disclosure. The circuit 200 is for high-sensitivity radiation sensing, and is particularly suitable for use in applications such as ambient light sensing, proximity sensing and flicker detection, where an intensity of incident radiation may be relatively low. The circuit 200 comprise a first transistor 205. The first transistor 205 is configurable to reset a voltage-level at a circuit node 210 to a voltage-level defined by the voltage reference 220. In some embodiments, the voltage reference 220 may be a power supply rail, e.g., VDD.

A gate of the first transistor 205 is coupled to processing circuitry 215. The processing circuitry 215 may for example, comprise a processor, digital logic, a state machine, or the like. In some embodiments the processing circuitry 215 may comprise a programmable processor and a memory.

A source of the first transistor 205 is coupled to the voltage reference 220. A drain of the first transistor 205 is coupled to the circuit node 210. The processing circuitry 215 may be configurable to control a voltage at the gate of the first transistor 205 to enable current to flow between the source and drain. As such, the processing circuitry 215 is configurable to reset a voltage-level at a circuit node 210 to a voltage-level corresponding to the voltage reference 220, minus any voltage dropped across the source-drain of the first transistor 205.

The example circuit 200 of FIG. 2 comprises a photodiode 250. It will be appreciated that although FIG. 2 depicts a single photodiode 250, in some embodiments a plurality of photodiodes may be implemented. In some embodiments, the one or more photodiodes is/are island photodiodes.

A cathode of the photodiode 250 is coupled to the circuit node 210, e.g. to drain 210 of the first transistor 220. In some embodiments, the cathode of the photodiode 250 is coupled to the circuit node 210 via a second transistor 255 and/or a third transistor 265, as described in more detail below.

An anode of the photodiode 250 is coupled to a further voltage reference 285 which, in the example circuit 200 of FIG. 2, is a ground reference, e.g. 0 volts.

In embodiments of the circuit 200 comprising the second transistor 255, a gate of the second transistor 255 is coupled to the processing circuitry 215. A source of the second transistor 255 is coupled to the cathode of the photodiode 250. A drain of the second transistor 255 is coupled either directly to circuit node 210, or in embodiments implementing the third transistor 265, A drain of the second transistor 255 is coupled to a source of the third transistor 265 and a drain of the third transistor 265 is coupled to the circuit node 210.

As such, the second transistor 255 is controlled by the processing circuitry 215 and configurable to isolate the photodiode 250 from a remainder of the circuit 200, and in particular from measurement circuitry 230 as described below.

Also depicted in the example circuit 200 of FIG. 2 is a fourth transistor 225 configured as a source-follower. A gate of the fourth transistor 225 is coupled to the circuit node 210. A drain of the fourth transistor 225 is coupled to the voltage reference 220, and a source of the fourth transistor 225 is coupled to the measurement circuitry 230. As such, the fourth transistor 225 operates as a buffer, enabling a voltage-level corresponding to a voltage-level at the circuit node 210 to be measured by the measurement circuitry 230, without drawing significant current from the circuit node 210.

In some embodiments, the measurement circuitry 230 may comprise a voltage amplifier and an analog-to-digital converter, as depicted in the example measurement circuitry 130 of the circuit 100 of FIG. 1.

As such, the measurement circuitry 230 is configured to measure the voltage-level corresponding to the voltage-level at the circuit node 210. That is, the measurement circuitry 230 is configured to measure the voltage-level at the circuit node 210 minus any voltage drop across the fourth transistor 225.

In some embodiments, the processing circuitry 215 is configured to control the measurement circuitry 230 and/or receive an output from the measurement circuitry 230. That is, in some embodiments, the processing circuitry 215 may configure the measurement circuitry to measure the voltage-level at the circuit node 210.

The example circuit 200 of FIG. 2 also comprises a capacitor 270. The capacitor 270 has a first terminal coupled to the circuit node 210 and a second terminal coupled to the voltage reference 220.

It will be appreciated that, in some embodiments of the disclosure, the capacitor 270 is not implemented. Instead, a capacitance of the photodiode 250, in addition to any parasitic capacitance in the circuit 200 between the photodiode 250 and the gate of the further transistor 225 suffices to provide adequate capacity for storing charge to generate a measurable voltage.

Operation of the circuit 200 is as follows. At an initial time, the first transistor 205 is turned on, e.g. a voltage applied at the gate of the first transistor 205 to enable current flow from source to drain, thereby charging the photodiode 250 and, if implemented, the capacitor 270 and setting an initial voltage-level at the circuit node 210 to the voltage-level at or close to the voltage reference 220.

Subsequently, the first transistor 205 is turned off by the processing circuitry 215, thereby isolating the circuit node 210 and the cathode of the photodiode 250 from the voltage reference 220. In some embodiments, a time when the first transistor 205 is turned off establishes a start of an integration period. In other embodiments, the integration period may commence at a time after the first transistor 205 is turned off.

In some embodiments, the processing circuitry 215 comprises a timer, or is configured to operating as a timer, to define the integration period.

As the photodiode 250 is exposed to incident radiation, a generated photocurrent discharges the cathode of the photodiode 250 and, if implemented, the capacitor 270. As such, a voltage-level at the circuit node 210 drops. That is, the photodiode 250 is configured to vary the voltage-level at the circuit node 210 in response to radiation incident upon the photodiode 250 during the integration period.

As also described above with reference to FIG. 1, in some embodiments the processing circuitry 215 is configured to control the first transistor 205 to reset the voltage-level at the circuit node 210 and to subsequently configure the measurement circuitry 230 to measure the voltage-level at a start and then at an end of the integration period. That is, in order to reduce the effects of noise, the processing circuitry 215 may be configured to control the measurement circuitry 230 to perform two measurements. A difference between these measurements may provide a better indication of an intensity of radiation incident upon the photodiode 250 than a single measurement. That is, errors such as systematic errors that may be introduced due to dark current, can be accounted for. As such, extremely high-sensitivity measurements of an intensity of incident radiation may be made. In some embodiments, the processing circuitry 215 may be configured to determine the difference, e.g. an output from the measurement circuitry 230 is provided to the processing circuitry 215. In some embodiments, an output 245 from the measurement circuitry 230 is additionally or alternatively provided to further processing circuitry (not shown).

Furthermore, in embodiments of the circuit 200 of FIG. 2 comprising the second transistor 255, the second transistor 255 is also controlled by the processing circuitry 215 and configurable to isolate the at least one photodiode 250 from the measurement circuitry 230. As such, in some embodiments, the processing circuitry 215 is configured to determine a difference between measurements of the voltage-level at the circuit node 210 made by the measurement circuitry 230 with and without the photodiode 250 isolated from the measurement circuitry 230.

By performing such correlated measurements with and without isolation of the photodiode 250 from the remainder of the circuit 200, the measurement circuitry 230 can be configured to perform a measurement that accounts for errors, such as systematic errors, in the circuit. Such measured errors may subsequently be subtracted from a measurement of radiation intensity made using the photodiode 250. The correlated measurements may be performed before or after an integration period.

In some embodiments, the circuit 200 also comprises an error amplifier circuit 275. Such an error amplifier circuit 275, if implemented, is configured to minimize a bias across the at least one photodiode 250 as described in more detail below. Advantageously, by minimizing a bias across the photodiode 250, a leakage current from the photodiode 250 can also be minimized, thus reducing a dark current in the circuit 200 and thereby enabling higher accuracy and higher sensitivity measurements of an intensity level of incident radiation.

In the example embodiment of FIG. 2, the error amplifier circuit 275 comprises an operational amplifier 280 having a first input coupled to the anode of the photodiode 250, and a second input coupled to the cathode of the photodiode 250. It will be understood that, in embodiments implementing the second transistor 255 as described above, the second input to the operational amplifier 280 would be coupled to the cathode of the photodiode 250 via the second transistor 255, e.g. to a drain of the second transistor 255, wherein a source of the second transistor 255 is coupled to the cathode of the photodiode 250.

Embodiments of the circuit 200 comprising the error amplifier circuit 275 also comprise the third transistor 265, wherein an output of the error amplifier circuit 275, e.g. an output of the operational amplifier 280, is coupled to a gate of the third transistor 265. A source of the third transistor 265 is coupled to a cathode of the photodiode 250, via the second transistor 255 in some embodiments as described above, and a drain of the third transistor 265 is coupled to the circuit node 210.

Advantageously, such an arrangement enables the error amplifier circuit 270 to minimize a bias that may exist across the photodiode 250. Furthermore, by having the error amplifier circuit 275 coupled to the gate of the third transistor 265, the error amplifier circuit 275 is prevented from driving current towards the circuit node 210. That is, the error amplifier circuit 275 may be configured to maintain the bias across the photodiode 250 at, or close to, zero volts without drawing any current from it. That is, in some embodiments, the error amplifier is equipped with auto-zero correction to ensure near zero bias for photo-diode.

In some embodiments, the error amplifier circuit 275 may be configurable to provide a negative bias across the photodiode 250. For example, in embodiments of the circuit 200 in which the anode of the photodiode 250 is shared with the error amplifier, this may be achieved by providing the operational amplifier 280 with a negative supply voltage.

In example embodiments in which the anode of the photodetector 250 is separate from the error amplifier circuit 275, such as that depicted in FIG. 2, the anode of the photodiode 250 may be slightly positive with respect to a return supply of the operational amplifier 280. This example is depicted in FIG. 2, wherein a ground reference 290 is separate from the further voltage reference 285. That is, in some embodiments, in order to provide a negative bias across the photodiode 250, a ground reference at the anode of the photodiode 250 may be at a slightly higher voltage than a ground reference for a power supply to the operational amplifier 280.

That is, in some embodiments it may be necessary to drive a slightly negative voltage to fully reduce a bias from across the photodiode 250, when taking into account any voltage drop that may exist within the circuit between an output of the operational amplifier 280 and the cathode of the photodiode 250.

It will be appreciated that in some embodiments the anode of the photodetector 250 may be coupled to the operational amplifier 280, e.g. a ground reference at the anode of the photodiode 250 may be at the same voltage as the ground reference for the power supply to the operational amplifier 280.

Figure 3:
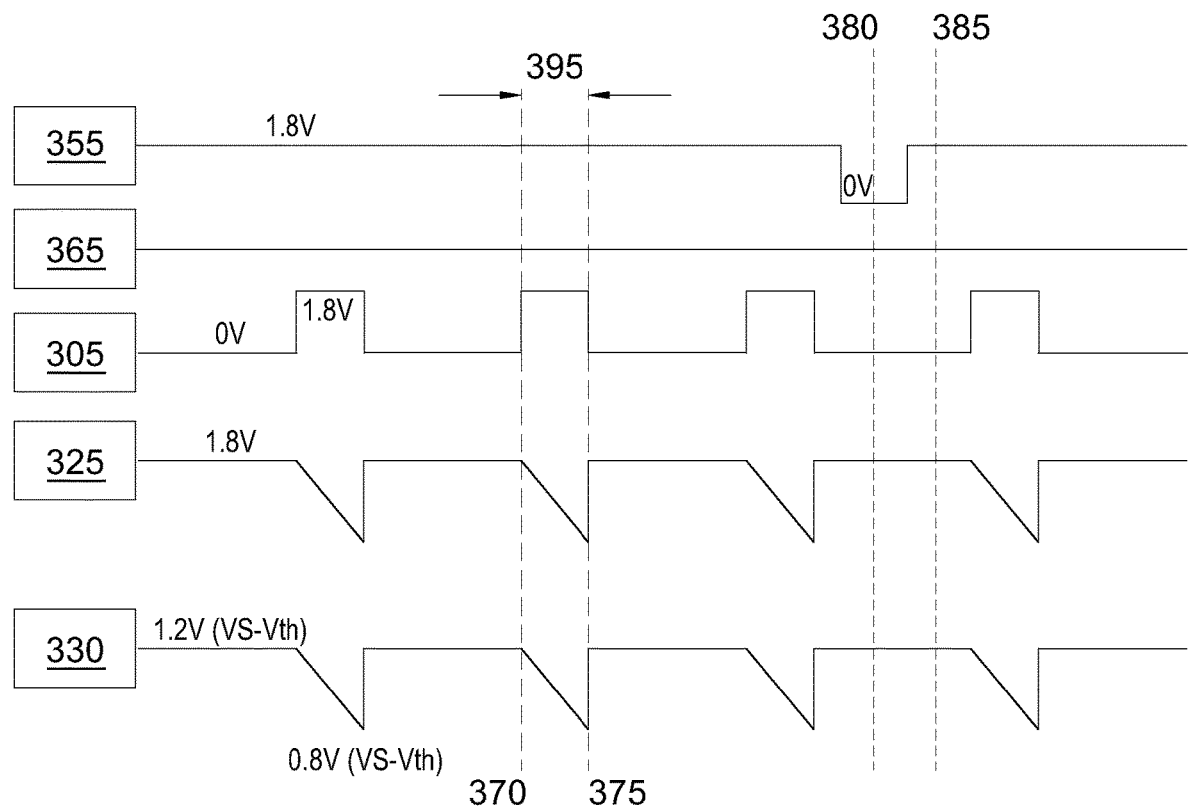
FIG. 3 a timing diagram corresponding to operation of the circuit for sensing radiation of FIG. 2.

FIG. 3 depicts an example of a timing diagram corresponding to operation of the circuit 200 for sensing radiation of FIG. 2.

A gate voltage 305 corresponds to a voltage at a gate of the first transistor 205. It can be seen that the gate voltage 355 varies between 1.8V, when current is disabled from flowing between the source and drain of the first transistor 205, to 0V wherein current flow is enabled to charge the photodiode 250 and, if implemented, the capacitor 270. The processing circuitry 215 is configured to control the gate voltage 305.

It will be appreciated that 1.8V is provided for purposes of example only, and in other embodiments and depending upon a particular technology-node selected, a voltage corresponding to a logic high voltage which may vary from 1.8V, e.g. 1.2V, 1.5V, or the like.

A period when the gate voltage 305 is at 1.8V represents the integration period 395. That is, when the gate voltage 305 is at 1.8V the circuit node 210 is not coupled to the voltage reference 220, and can start to discharge due to a photo-current induced in the photodiode 250.

A gate voltage 355 corresponds to a voltage at a gate of the second transistor 255. It can be seen that, during each integration period 395, the gate voltage 355 is maintained at 1.8V by the processing circuitry 215, thereby a current flow through the second transistor 255 induced by a photocurrent in the photodiode 250.

At a time outside the integration period 395, the processing circuitry 215 may be configured to negate the gate voltage 355, thereby disabling current flow through the second transistor 225 and isolating the photodiode 250 from the remainder of the circuit 200. At a first time 380 while the photodiode 250 is isolated, the measurement circuitry 230 may be configured by the processing circuitry 215 to measure a voltage at the circuit node 210. At a second time 385 while the photodiode 250 is not isolated, the measurement circuitry 230 may be configured by the processing circuitry 215 to measure the voltage at the circuit node 210. As described above, by using a difference between the two measurements at first time 380 and second time 385, an error such as a dark current in the circuit 200 may be measured. It will be appreciated that in other embodiments the two measurements made at first time 380 and second time 385 may instead be made in the alternate order.

A gate voltage 365 corresponds to a voltage at a gate of the third transistor 265. Although for purposes of example the gate voltage 365 is depicted as constant, in the above described embodiment the gate voltage 365 may vary from approximately −100 mV to +500 mV, depending upon a current from the photo diode 250.

A gate voltage 325 corresponds to a voltage at a gate of the fourth transistor 225, and thereby represents a voltage at the circuit node 210. As described above, in order to account for an error in the circuit 200, the processing circuitry 215 may be configured to control the first transistor 205 to reset the voltage-level at the circuit node 215, and hence gate voltage 325, and to subsequently configure the measurement circuitry 215 to measure a voltage corresponding to the gate voltage 325 at a start 370 of the integration period 395 and at an end 375 of the integration period 395. In the example of FIG. 3, the gate voltage 325 varies from approximately 1.8V at a start of the integration period 395, to approximately 1.4V at the end of the integration period 390. It will be appreciated that a magnitude of a drop in the gate voltage 325 over the integration period 395 is determined, at least in part, by characteristics of the photodiode 250 and, if implemented, a size of the capacitor 270.

A voltage 330 corresponds to a voltage at the source of the fourth transistor 225. That is, the voltage 330 corresponds to the gate voltage 325, minus a threshold voltage of the fourth transistor 225. As such, the measurement circuitry 230 is configured to measure the voltage 330, which corresponds to the voltage at the circuit node 210, and in the example of FIG. 3, this voltage varies from between approximately 1.2V and 0.8V.

Figure 4A:
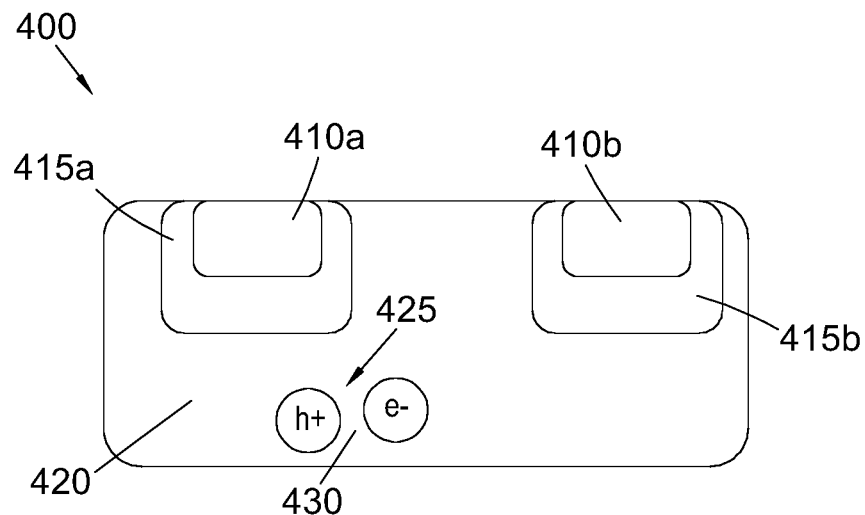
FIG. 4a a representation of a cross-section of an island photodiode.

FIG. 4a depicts a representation of a cross-section of an island photodiode 400. The island photodiode 400 comprises a plurality of n-wells 410a, 410b implemented in a larger p-well 420, or a bulk p-substrate. Each n-well 410a, 410b is separated from the surrounding larger p-well 420 by an associated depletion region 415a, 415b. Photons 425 striking the photodiode 400 may generate electron-hole pairs 430. When an electron of an electron-hole pair 430 contacts any depletion region 415a, 415b, and/or when an electron-hole pair 430 is formed in the depletion region 415a, 415b, the electrons propagate towards the n-well 410a, 410b due to the inherent electric field in the depletions regions, thus producing a photo-current.

In contrast to known n-well photodiodes wherein an n-well may cover most or all of an area of the photodiode that is exposed to incident radiation, in an island photodiode only a relatively small area of the photodiode that is exposed to incident radiation comprises n-wells. As such, an effective area of an island photodiode relatively small, and thus a capacitance of the island photodiode is also relatively small.

Figure 4B:
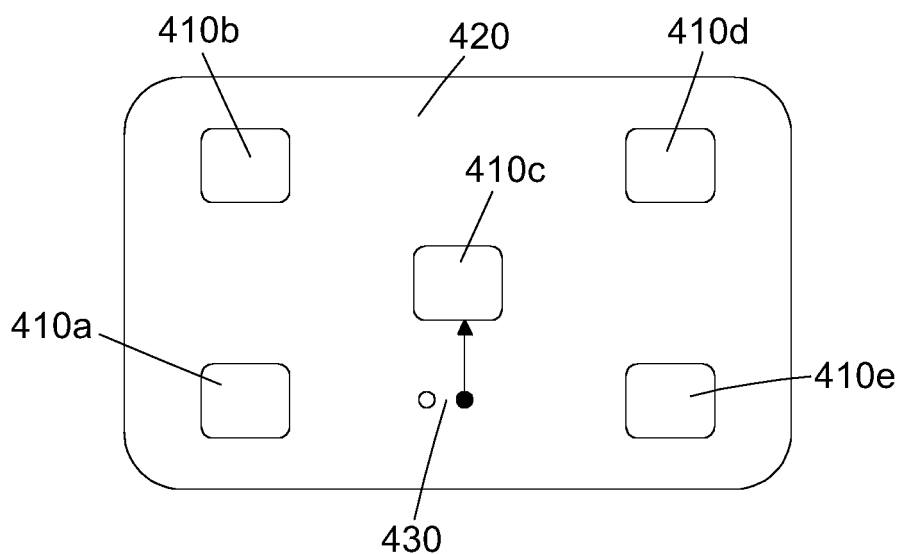
FIG. 4b a representation of a top view of an island photodiode.

FIG. 4b depicts a representation of a top view of the island photodiode 400 of FIG. 4a. It can be seen that the island photodiode 400 comprises a plurality of n-wells 410a-410e, and that a total area of the n-wells 410a-410e is substantially lower than a total area of the larger p-well 420, or a bulk p-substrate.

The plurality of n-wells 410a-410e may be connected by a conductor (not shown), thus forming a cathode of the island photodiode 400.

Due to the low capacitance of island photodiodes, implementation of such an island photodiode 400 in the circuit 100 of FIG. 1 or the circuit 200 of FIG. 2 may result in an extremely sensitive circuit for sensing radiation. That is, due to the inherent low capacitance of the island photodiode, only a small photocurrent incurred by a low intensity of incident radiation may result in a relatively large change in the voltage-level at the cathode of the photodiode. Such sensitivity, coupled with the above described features of the error amplifier circuit 275, the measurements of the voltage-level at a start and at an end of the integration period, and measurements of errors in the circuit 200 with the photodiode effectively isolated by the second transistor 255, enable extremely high-sensitivity sensing of low-intensity incident radiation.

Figure 5:
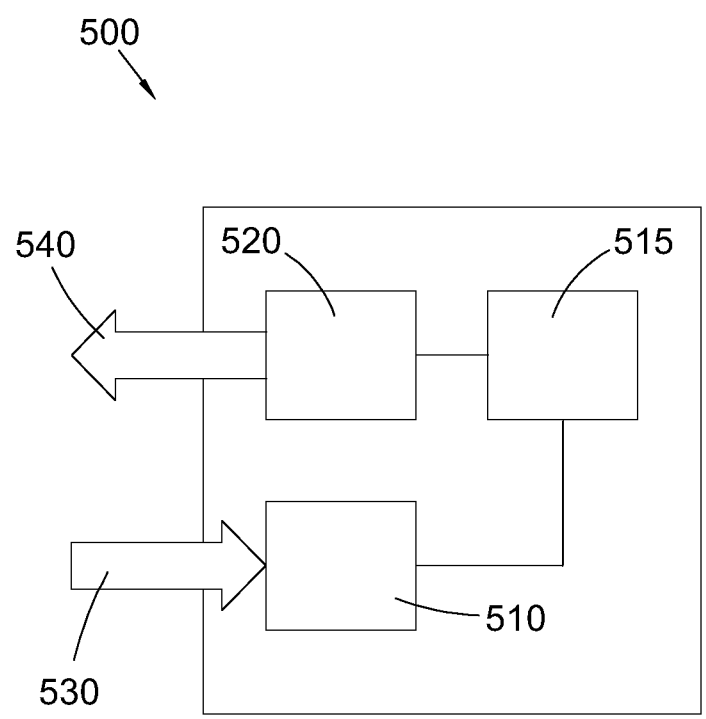
FIG. 5 an apparatus comprising a circuit for sensing radiation according to an embodiment of the disclosure.

FIG. 5 depicts an apparatus 500 comprising a circuit 510, wherein the circuit 510 may be a circuit 100, 200 as described above with reference to FIGS. 1 and 2, and wherein the apparatus 500 is configured for at least one of: ambient light sensing; proximity sensing; or flicker detection. The apparatus 500 may, for example, be one of: a smartphone; a cellular telephone; a tablet; a laptop.

The circuit 510 may be coupled to a processor 515 and/or a storage device. The apparatus 500 may comprise an LED display 520. The processor 515 may be coupled to the LED display 520, and configured to control the LED display 520.

In some embodiments, the circuit 510 may be configured to sense an intensity of ambient radiation 530 incident upon one or more photodiodes in the circuit 510. The circuit 510 may be configured to provide data and/or a signal corresponding to the intensity of the ambient radiation 530 to the processor 515. In some embodiments, the processor 515 may adapt the LED display 520 based upon the sensed intensity of the ambient radiation 530. For example, the processor may increase a brightness of the LED display 520 in response to detecting a relatively high intensity of ambient radiation 530, e.g. direct sunlight.

Due to the high sensitivity of the circuit 510 as described above, the circuit 510 is particularly suited towards sensing low levels of ambient radiation. For example, in some embodiments the at least one photodiode of the circuit 510 may be disposed rearward of a surface of the LED display 520 configured to emit radiation 540. In such embodiments, the at least one photodiode of the circuit 510 may be configured to receive ambient radiation 530 propagating through the LED display 520.

Although the disclosure has been described in terms of particular embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims.

Each feature disclosed or illustrated in the present specification may be incorporated in any embodiments, whether alone or in any appropriate combination with any other feature disclosed or illustrated herein.

LIST OF REFERENCE NUMERALS

| 100 | circuit | 275 | error amplifier circuit |
|---|---|---|---|
| 105 | first transistor | 280 | operational amplifier |
| 110 | circuit node | 285 | further voltage reference |
| 115 | processing circuitry | 305 | gate voltage |
| 120 | voltage reference | 325 | gate voltage |
| 125 | further transistor | 330 | voltage |
| 130 | measurement circuitry | 355 | gate voltage |
| 135 | voltage amplifier | 365 | gate voltage |
| 140 | analog-to-digital converter | 370 | start |
| | | 375 | end |
| 145 | output | 380 | first time |
| 150 | photodiode | 385 | second time |
| 185 | further voltage reference | 395 | integration period |
| 150 | photodiode | 400 | island photodiode |
| 200 | circuit | 410a-410e | n-wells |
| 205 | first transistor | 415a, 415b | depletion region |
| 210 | circuit node | 420 | p-well |
| 215 | processing circuitry | 425 | photons |
| 220 | voltage reference | 430 | electron-hole pair |
| 225 | fourth transistor | 500 | apparatus |
| 230 | measurement circuitry | 510 | circuit |
| 245 | output | 515 | processor |
| 250 | photodiode | 520 | LED display |
| 255 | second transistor | 530 | ambient radiation |
| 265 | third transistor | 540 | radiation |
| 270 | capacitor | | |

The invention claimed is:

1. A circuit for sensing radiation, the circuit comprising:
a first transistor configurable to reset a voltage-level at a circuit node to a voltage reference;
measurement circuitry configured to measure the voltage-level at the circuit node;
at least one photodiode configured to vary the voltage-level at the circuit node in response to radiation incident upon the photodiode during an integration period;
processing circuitry configured to control the first transistor to reset the voltage-level at the circuit node and to subsequently configure the measurement circuitry to measure the voltage-level at a start and at an end of the integration period;
a second transistor controlled by the processing circuitry and configurable to isolate the at least one photodiode from the measurement circuitry;
an error amplifier circuit configured to minimize a bias across the at least one photodiode; and
a third transistor, wherein an output of the error amplifier circuit is coupled to a gate of the third transistor, a source of the third transistor is coupled to a cathode of the at least one photodiode, and a drain of the third transistor is coupled to the circuit node.

2. The circuit of claim 1, wherein the processing circuitry is configured to determine an intensity of the incident radiation based upon a difference between the voltage-level at the start and at the end of the integration period.

3. The circuit of claim 1, wherein the at least one photodiode comprises an island photodiode.

4. The circuit of claim 1, comprising a capacitor having a first terminal coupled to the circuit node and a second terminal coupled to the voltage reference.

5. The circuit of claim 1, wherein the processing circuitry is configured to determine a difference between measurements of the voltage-level made by the measurement circuitry with and without the at least one photodiode isolated from the measurement circuitry.

6. The circuit of claim 1, wherein the error amplifier circuit is configurable to provide a negative voltage at the gate of the third transistor.

7. The circuit of claim 1, wherein a first input to the error amplifier circuit is coupled to an anode of the at least one photodiode, and a second input to the error amplifier circuit is coupled to the cathode.

8. The circuit of claim 1 comprising a fourth transistor configured as a source-follower, wherein a gate of the fourth transistor is coupled to the circuit node, and a source of the fourth transistor is coupled to the measurement circuitry.

9. The circuit of claim 1 comprising, wherein the processing circuitry comprises a timer configured to define the integration period.

10. An apparatus comprising the circuit according to claim 1, wherein the apparatus is configured for at least one of:
    ambient light sensing;
    proximity sensing; or
    flicker detection.

\* \* \* \* \*